United States Patent [19]

Hirano

[11] Patent Number: 4,758,737
[45] Date of Patent: Jul. 19, 1988

[54] CLOCK GENERATOR CIRCUIT

[75] Inventor: Takaaki Hirano, Nara, Japan

[73] Assignee: Sharp Kabushiki Kaisha, Japan

[21] Appl. No.: 85,818

[22] Filed: Jul. 20, 1987

Related U.S. Application Data

[63] Continuation of Ser. No. 816,067, Jan. 3, 1986.

[30] Foreign Application Priority Data

Feb. 13, 1985 [JP] Japan ................... 60-27396

[51] Int. Cl.⁴ .................... H03K 5/13; H03K 1/17
[52] U.S. Cl. .................... 307/269; 328/63;
328/72; 328/109; 307/480; 307/271; 307/262
[58] Field of Search ............ 328/63, 72, 109, 133;
307/479, 480, 527, 528, 511, 518, 269, 262, 271;
377/106

[56] References Cited

U.S. PATENT DOCUMENTS

| | | | |
|---|---|---|---|
| 3,979,732 | 9/1976 | Hepworth et al. | 340/172.5 |
| 4,101,838 | 7/1978 | Aihara et al. | 328/63 |
| 4,408,333 | 10/1983 | Fujii | 375/95 |

Primary Examiner—Stanley D. Miller
Assistant Examiner—Richard Roseen
Attorney, Agent, or Firm—Flehr, Hohbach, Test, Albritton & Herbert

[57] ABSTRACT

A clock generator circuit of this invention is for an integrated circuit which is controlled by clock signals obtained by frequency-dividing a standard clock. Three flip-flops, two of which are connected in series, and two logical gates together form a synchronization circuit such that when a command signal is inputted to start testing the integrated circuit, frequency-divided clock signals in synchronism with a standard clock are outputted.

4 Claims, 1 Drawing Sheet

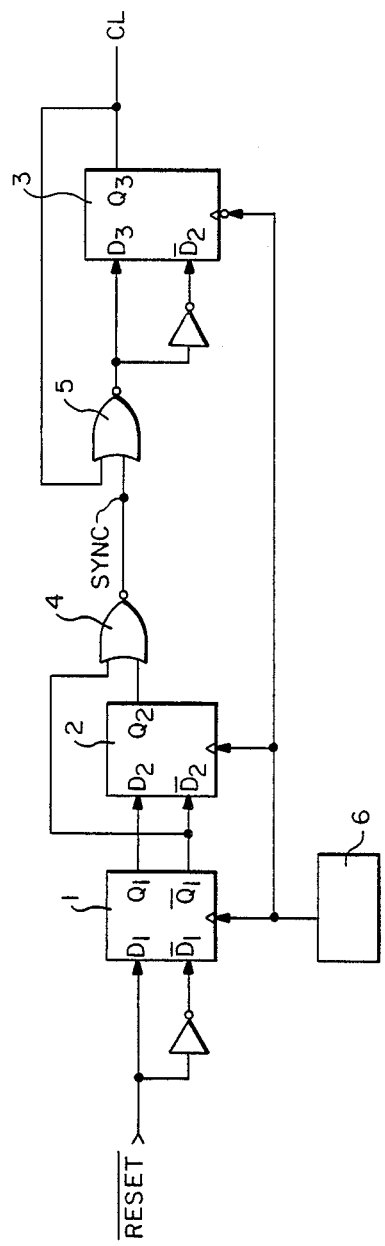
FIG.—1
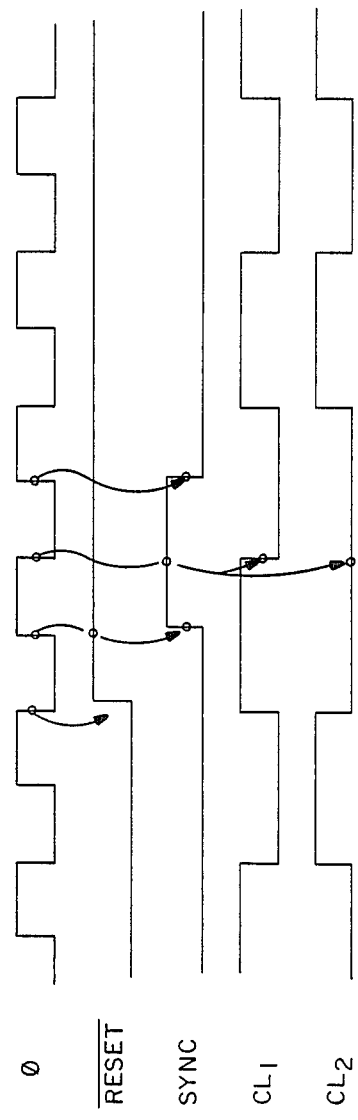
FIG.—2

CLOCK GENERATOR CIRCUIT

This is a continuation of application Ser. No. 816,067 filed Jan. 3, 1986.

This invention relates to a clock genertor circuit for a large scale integrated circuit (LSI) and more particularly to a generator circuit for a frequencydivided clock synchronized to a standard clock suited for inspecting an LSI by means of a testing apparatus.

When an LSI is tested after it is fabricated, it is necessary before the testing is started to synchronize with respect to a standard clock a frequency-divided clock which is used for driving the LSI. This invention relates to a circuit for generating within an LSI a clock which is in synchronism with a standard clock and serves as a frequency-divided clock necessary for driving the LSI in response to a command to start the testing.

An LSI for a microprocessor, for example, requires clock signals in order to execute its intended functions. Such clock signals are generally provided either from an oscillator circuit contained in the LSI or from an external oscillator circuit. When such a standard clock directly provided from an oscillator circuit is frequency-divided to form a frequency-divided clock for driving the LSI, however, its polarity relationship is usually indefinite during an initial period of the LSI operation.

When an LSI is tested at the end of its fabrication process, therefore, it is necessary to initially check the polarity relationship between the standard clock and the frequency-divided clock and to ascertain that they are in a desired relationship before the LSI is set inside a testing apparatus and its functions are tested.

It is therefore an object of the present invention to provide a clock generator circuit for an LSI which obviates the necessity of matching polarity at the time of testing the functions of the LSI so that the structure of its testing apparatus can be simplified and the time required for the testing can be reduced.

The above and other objects of the present invention are achieved by adding to an LSI a synchronizing circuit, which, when a command to start the testing is inputted, serves to output frequency-divided clock signals which are in synchronism and in a unique polarity relationship with the standard clock signals.

The accompanying drawings, which are incorporated in and form a part of the specification, illustrate one embodiment of the present invention and, together with the description, serve to explain the principles of the invention.

FIG. 1 is a block circuit diagram of a clock generator circuit embodying the present invention.

FIG. 2 is a signal waveform diagram for explaining the operation of the circuit of FIG. 1.

With reference to FIG. 1, a first flip-flop 1 and a second flip-flop 2 are connected in series. A command to start testing such as a $\overline{RESET}$ signal for resetting and initializing the LSI is inputted to the input terminal $D_1$ of the first flip-flop 1 and its inversion RESET is inputted to the input termianl $\overline{D}_1$ through an inverter. The system according to this embodiment is intended to become reset when the aforementioned signal $\overline{RESET}$ is at a low level and to become active when it is at a high level.

Numeral 4 indicates a first NOR gate into which the outputs from the terminal $\overline{Q}_1$ of the first flip-flop 1 and the terminal $Q_2$ of the second flip-flop 2 are inputted. The output SYNC from this NOR gate 4 and the output from the terminal $Q_3$ of a third flip-flop 3 are inputed into a second NOR gate 5. The output signal from the second NOR gate 5 and its inversion signal are inputted respectively to the input terminals $D_3$ and $\overline{D}_3$ of the third flip-flop 3. The output from the terminal $Q_3$ of the third flip-flop 3 is taken out as the output clock CL of a synchronization circuit and also inputted to the second NOR gate 5.

The three flip-flops 1, 2 and 3 shown in FIG. 1 are all a D flip-flop circuit and standard clock signals $\phi$ are provided from an oscillator circuit 6 internally contained in the LSI or an external oscillator circuit for driving these flip-flops. The first and second flip-flops 1 and 2 are activated when the standard clock $\phi$ rises and the third flip-flop 3 is activated when the standard clock $\phi$ falls.

When the circuit of FIG. 1 is used for the execution of a test, the command signal $\overline{RESET}$ is brought to a high level immediately after the standard clock $\phi$ has a fall as shown in FIG. 2. When this $\overline{RESET}$ signal is inputted, a SYNC signal is outputted from the first NOR gate by the NOR logic between the output signals from the first and second flip-flops 1 and 2. Thus, the output signal SYNC is maintained at a high level for a period of one cycle from the rise of the standard clock $\phi$ about one-half cycle after the rise of the command signal $\overline{RESET}$.

The output from the second NOR gate 5 is necessarily at a low level as long as the output signal SYNC is at a high level because both the aforementioned output signal SYNC and the output from the third flip-flop 3 are inputted to the second NOR gate 5. As a result, the output $Q_3$ from the third flip-flop 3 necessarily becomes low during the period of one cycle, delayed by one-half cycle from the one-cycle period during which the output signal SYNC remains at a high level. Thereafter, signals $CL_1$ (or $CL_2$) obtained by frequency-dividing the standard clock $\phi$ are outputted from the output terminal $Q_3$ of the third flip-flop 3. In other words, the output $CL_1$ (or $CL_2$) from the third flip-flop 3 becomes low, independently of its initial condition, in approximately the second cycle of the standard clock $\phi$ when the command signal $\overline{RESET}$ is at a high level. Synchronism with the standard clock $\phi$ is thus achieved.

FIG. 2 shows that the output from the third flip-flop 3 can be either $CL_1$ or $CL_2$. In other words, it can assume either of two waveforms which are opposite in polarity before the output signal SYNC is generated, but it is uniquely determined after the output signal SYNC is generated, independently of the initial condition of the clock.

In the above, the present invention was explained by way of an embodiment according to which the system is reset in synchronism with a rise in the clock circuit but a circuit may be designed such that the system is reset in synchronism with a fall. In the latter situation, the first NOR gate 4 of FIG. 1 must be replaced by an OR gate and the second NOR gate 5 of FIG. 11 by a NAND gate.

In summary, a circuit according to this invention serves to generate clock signals inside the LSI in synchronism with a standard clock when a command signal is inputted. With the help of such a circuit, a frequency-divided clock required for the testing of the functions of the LSI can be quickly synchronized with the standard clock so that the testing can be carried out speedily and the requirements imposed on the testing apparatus can be reduced.

The foregoing description of a preferred embodiment of the invention has been presented for purposes of illustration and description. It is not intended to be exhaustive or to limit the invention to the precise form disclosed, and obviously many modifications and variations are possible in light of the above teaching. Such modifications and variations which may be apparent to a person skilled in the art are intended to be within the scope of this invention.

What is claimed is:

1. A clock generator circuit for an integrated circuit controlled by a frequency-divided clock obtained by frequency-dividing a standard clock, comprising a first flip-flop with a true output and a false output, a second flip-flop connected to said true output and said false output of said first flip-flop and having a second output, a first logical gate with first gate inputs and a first gate output, said first gate inputs being connected each to said false output of said first flip-flop and to said second output of said second flip-flop, a third flip-flop having a clock signal output terminal from which clock signal for operating an integrated circuit is outputted, and a second logical gate with second gate inputs and a second gate output, said second gate inputs being connected each to said clock signal output terminal of said third flip-flop and said first gate output and said second gate output being connected to said third flip-flop, said first flip-flop, said second flip-flop and said third flip-flop each having a clock input terminal connected to receive said standard clock.

2. The clock generator circuit of claim 1 wherein said first logical gate is a NOR gate and said second logical gate is another NOR gate.

3. The clock generator circuit of claim 1 wherein said first logical gate is an OR gate and said second logical gate is a NAND gate.

4. The clock generator circuit of claim 1 wherein said first, second and third flip-flops each include a D flip-flop.

* * * * *

UNITED STATES PATENT AND TRADEMARK OFFICE
CERTIFICATE OF CORRECTION

PATENT NO. : 4,758,737

DATED : July 19, 1988

INVENTOR(S) : Takaaki Hirano

It is certified that error appears in the above-identified patent and that said Letters Patent is hereby corrected as shown below:

Column 2, about line 58, change "FIG. 11" to --FIG. 1--.

Signed and Sealed this

Twentieth Day of December, 1988

Attest:

DONALD J. QUIGG

Attesting Officer

Commissioner of Patents and Trademarks